(12) United States Patent
Sugine

(10) Patent No.: US 7,767,476 B2
(45) Date of Patent: Aug. 3, 2010

(54) MANUFACTURING METHOD OF ARRAY SUBSTRATE AND MANUFACTURING METHOD OF LIQUID CRYSTAL DISPLAY DEVICE USING THE SAME

(75) Inventor: Mitsuaki Sugine, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 571 days.

(21) Appl. No.: 11/055,696

(22) Filed: Feb. 10, 2005

(65) Prior Publication Data

US 2006/0035391 A1    Feb. 16, 2006

(30) Foreign Application Priority Data

Aug. 13, 2004    (JP)    ............... 2004-235714

(51) Int. Cl.
*H01L 21/02*    (2006.01)
*G02F 1/13*    (2006.01)

(52) U.S. Cl. .................. 438/30; 438/34; 438/48; 438/149; 257/72; 257/432; 257/E21.53

(58) Field of Classification Search .......... 438/8, 438/12, 149, 151–159, 22–47, 163, 48; 349/30, 349/43–44, 67, 112–114; 257/59, 72, 98, 257/432, E21.53, E51.005–E51.006
See application file for complete search history.

(56) References Cited

U.S. PATENT DOCUMENTS

| 5,085,517 | A | | 2/1992 | Chadwick et al. | |
|---|---|---|---|---|---|
| 5,408,345 | A | * | 4/1995 | Mitsui et al. | 349/42 |
| 5,805,252 | A | * | 9/1998 | Shimada et al. | 349/113 |
| 5,949,507 | A | * | 9/1999 | Shimada et al. | 349/113 |
| 6,295,109 | B1 | * | 9/2001 | Kubo et al. | 349/119 |
| 6,341,002 | B1 | * | 1/2002 | Shimizu et al. | 349/119 |
| 6,342,935 | B1 | * | 1/2002 | Jang et al. | 349/113 |
| 6,376,271 | B1 | * | 4/2002 | Sawayama et al. | 438/30 |
| 6,452,653 | B1 | * | 9/2002 | Yamanaka et al. | 349/113 |
| 6,452,654 | B2 | * | 9/2002 | Kubo et al. | 349/114 |
| 6,466,882 | B1 | * | 10/2002 | Kang et al. | 702/84 |
| 6,469,759 | B2 | * | 10/2002 | Jang et al. | 349/113 |
| 6,483,562 | B1 | | 11/2002 | Fukuyoshi et al. | |
| 6,882,394 | B2 | | 4/2005 | Doi et al. | |
| 6,888,596 | B2 | * | 5/2005 | Nakayoshi et al. | 349/113 |
| 6,888,597 | B2 | * | 5/2005 | Ha et al. | 349/114 |
| 6,975,375 | B2 | * | 12/2005 | Fujino | 349/113 |
| 7,535,541 | B2 | * | 5/2009 | Yang et al. | 349/155 |

(Continued)

FOREIGN PATENT DOCUMENTS

JP    01-122515    5/1989

(Continued)

*Primary Examiner*—W. David Coleman
*Assistant Examiner*—Maliheh Malek
(74) *Attorney, Agent, or Firm*—Greer, Burns & Crain, Ltd.

(57) ABSTRACT

In the manufacturing method of the array substrate, an under layer having a surface with irregular irregularities is formed on a substrate, a metal film with irregularities profiling the surface of the under layer is formed on the under layer, a colored resist layer is formed on the metal film, the colored resist layer is patterned to form a regularly arranged colored resist pattern, an optical inspection is performed to optically detect a defect of the colored resist pattern, a defect of the colored resist pattern detected by the optical inspection is repaired; and the metal film is etched while using the resist pattern as a mask.

7 Claims, 9 Drawing Sheets

U.S. PATENT DOCUMENTS

| | | | |
|---|---|---|---|
| 7,538,840 B2 * | 5/2009 | Fujimori et al. | 349/114 |
| 7,692,740 B2 * | 4/2010 | Doi et al. | 349/113 |
| 2002/0021390 A1 * | 2/2002 | Jang et al. | 349/113 |
| 2002/0045112 A1 * | 4/2002 | Kishimoto et al. | 430/7 |
| 2002/0057407 A1 | 5/2002 | Yamaguchi et al. | |
| 2002/0085150 A1 | 7/2002 | Funamoto et al. | |
| 2002/0167009 A1 * | 11/2002 | Kim | 257/72 |
| 2002/0176029 A1 * | 11/2002 | Fujino | 349/43 |
| 2003/0017655 A1 * | 1/2003 | Lai et al. | 438/149 |
| 2003/0142247 A1 * | 7/2003 | Nishiyama et al. | 349/67 |
| 2004/0017152 A1 * | 1/2004 | Hashimoto et al. | 313/505 |
| 2004/0070709 A1 * | 4/2004 | Kanou et al. | 349/113 |
| 2004/0115846 A1 * | 6/2004 | Otake et al. | 438/22 |
| 2004/0169810 A1 * | 9/2004 | Fujimori et al. | 349/156 |
| 2004/0178411 A1 * | 9/2004 | Misaki et al. | 257/72 |
| 2005/0142678 A1 * | 6/2005 | Kim | 438/30 |
| 2005/0186359 A1 * | 8/2005 | Ishizuka et al. | 428/1.1 |
| 2006/0009133 A1 * | 1/2006 | Hashimoto et al. | 451/29 |
| 2006/0022203 A1 * | 2/2006 | Misaki et al. | 257/72 |
| 2006/0033866 A1 * | 2/2006 | Sugiura | 349/113 |
| 2007/0080349 A1 * | 4/2007 | Hoshino et al. | 257/59 |
| 2008/0174725 A1 * | 7/2008 | Fujimori et al. | 349/106 |

FOREIGN PATENT DOCUMENTS

| | | |
|---|---|---|
| JP | 2002-040626 | 2/2002 |
| JP | 2002-148609 | 5/2002 |
| JP | 2002-174514 | 6/2002 |
| JP | 2002-258277 | 9/2002 |
| KR | 2000-0062872 | 10/2000 |
| KR | 2003-0094015 | 12/2003 |

* cited by examiner

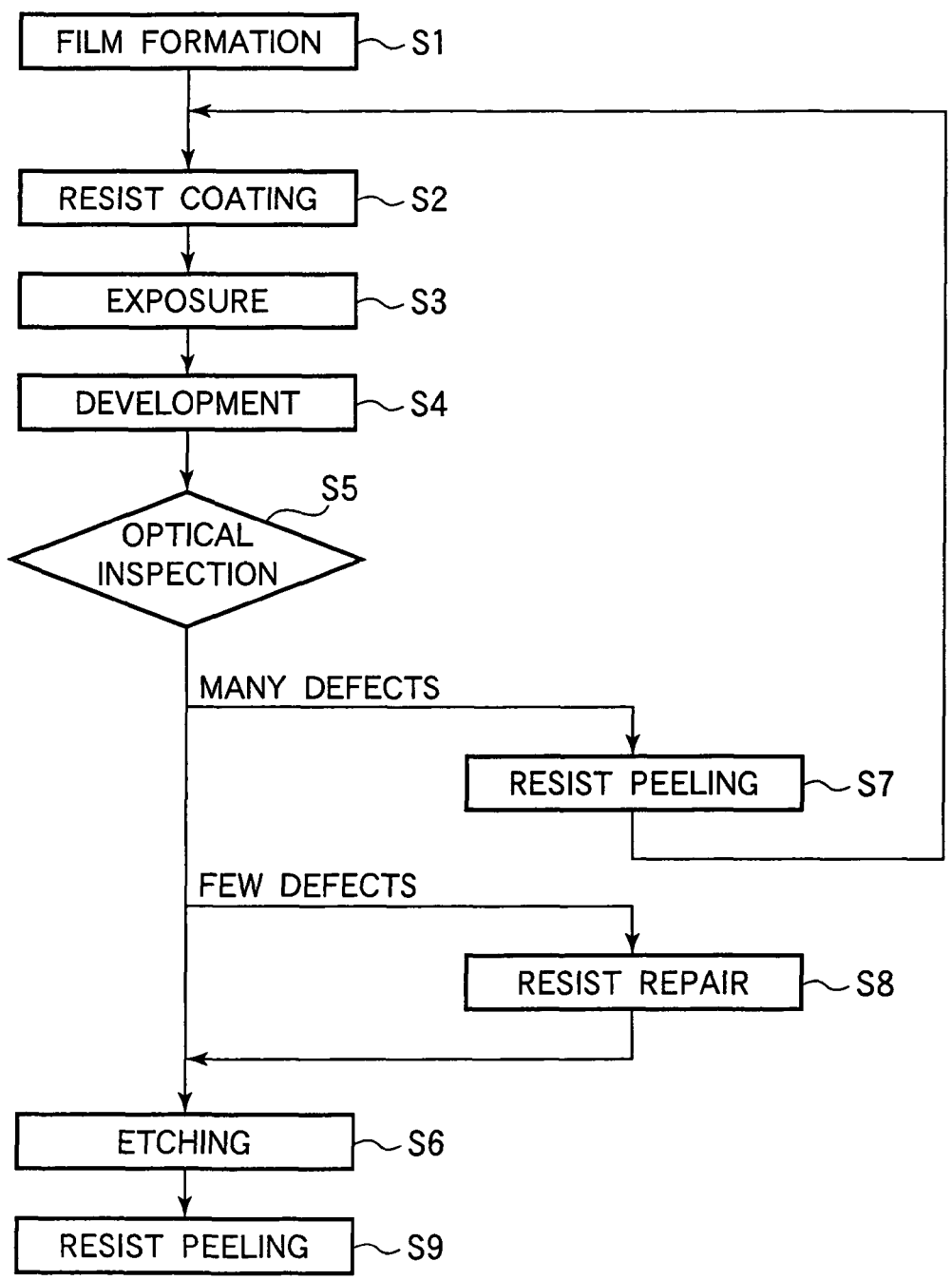

US 7,767,476 B2

MANUFACTURING METHOD OF ARRAY SUBSTRATE AND MANUFACTURING METHOD OF LIQUID CRYSTAL DISPLAY DEVICE USING THE SAME

BACKGROUND OF THE INVENTION

1. Field of the Invention

The present invention relates to a manufacturing method of an array substrate and a manufacturing method of a liquid crystal display device using the same, and particularly to a manufacturing method of an array substrate used for a reflective or transflective liquid crystal display device and a manufacturing method of a liquid crystal display device using the same.

2. Description of Related Art

An array substrate such as a thin film transistor (TFT) substrate is generally fabricated by repeating a process as described below. First, a conductive thin film and an insulating thin film are formed on an insulating substrate by using a sputtering method, a CVD method or the like. Next, a photoresist coated on the whole surface of the formed thin film to form a resist layer, is exposed to light through a specified photomask and is developed, so that a resist pattern having a specified shape is formed. Next, the thin film is etched while using the resist pattern as an etching mask, and the thin film having the specified shape is formed, and then, the resist pattern is peeled off.

In recent years, with the improvement in the resolution of a liquid crystal display device, it becomes necessary to increase the thickness of wiring and to improve the aperture ratio of a pixel. Thus, as a protection film formed on a TFT, not a silicon nitride (SiN) film or the like, but an organic insulating film which can be formed by using a spin coat method or the like has been often used. Since the organic insulating film is easy to be formed into a relatively thick film, a stepped portion formed by the increase in the thickness of the wiring can be flattened. Besides, when the organic insulating film is formed into the thick film, parasitic capacitance Cds formed between a pixel electrode and a drain bus line can be reduced, and therefore, it becomes possible to improve the aperture ratio of the pixel.

In the reflective or transflective liquid crystal display device, there is a structure in which irregularities are formed on the surface of a reflecting electrode, and incident light is scattered and reflected to improve reflection display characteristics. The irregularities of the reflecting electrode are formed by providing irregularities on the surface of the organic insulating film of the lower layer by using various methods. The irregularities of the surface of the organic insulating film are sometimes formed with irregular shapes in the respective pixels. At a later process after the irregularities are formed on the surface of the organic insulating film, for example, even if a defect such as a short circuit between reflecting electrodes occurs, an optical inspection for optically detecting defects by pattern comparison is difficult to carry out. Thus, conventionally, after the TFT substrate is completed, a tester is used to specify an address of a short circuit defect, and the short circuit part is cut by laser repair or the like to repair the defect. Originally, although only the layer of the reflecting electrode in which the short circuit defect occurs has only to be repaired, there is a case where especially in the TFT substrate with a high aperture ratio, another wiring line, such as a drain bus line, overlapping with the short circuit part is also cut. Accordingly, since dot defects and the like are increased, and the number of repair steps is increased, there occurs a problem that the display quality of the liquid crystal display device is lowered, and the manufacturing cost is increased.

SUMMARY OF THE INVENTION

An object of the present invention is to provide a manufacturing method of an array substrate in which the manufacturing cost of a liquid crystal display device can be reduced and excellent display quality can be obtained, and a manufacturing method of a liquid crystal display device using the same.

The above object is achieved by a manufacturing method of an array substrate, which comprises the steps of forming on a substrate an under layer having a surface with irregularities, forming on the under layer a thin film with irregularities profiling the surface of the under layer, forming a resist layer on the thin film, patterning the resist layer to form a regularly arranged resist pattern, performing an optical inspection to optically detect a defect of the resist pattern, and etching the thin film while using the resist pattern as a mask.

According to this invention, the manufacturing cost of the liquid crystal display device can be reduced and the excellent display quality can be obtained.

BRIEF DESCRIPTION OF THE DRAWINGS

FIG. 3 is a flowchart showing the manufacturing method of the array substrate according to the embodiment of the invention;

DETAILED DESCRIPTION OF THE INVENTION

Figure 1A:
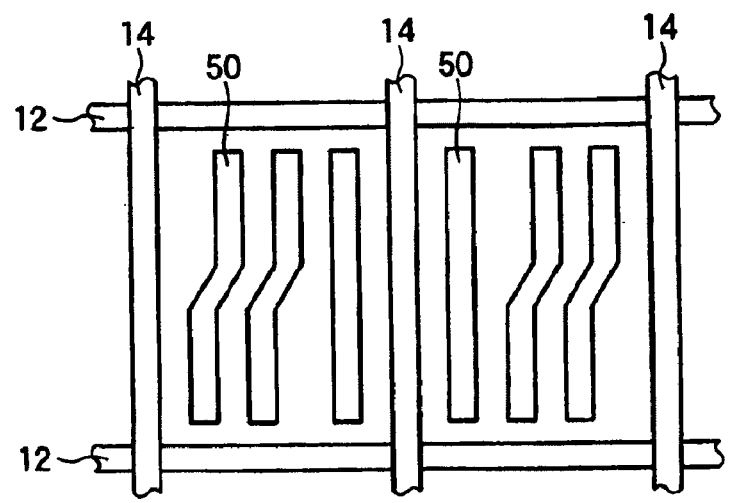
FIGS. 1A and 1B are views showing a manufacturing method of an array substrate according to an embodiment of the invention.

A manufacturing method of an array substrate according to an embodiment of the present invention and a manufacturing method of a liquid crystal display device using the same will be described with reference to FIGS. 1A to 9. FIGS. 1A to 2B schematically show a manufacturing method of a TFT substrate of a reflective liquid crystal display device according to this embodiment. FIG. 3 is a flowchart showing a main part of the manufacturing method of the TFT substrate of the reflective liquid crystal display device according to this embodiment. As shown in FIG. 1A, first, gate bus lines 12 extending in the horizontal direction in the drawing and drain bus lines 14 extending in the vertical direction in the drawing are formed on a substrate. Structures 50 arranged in irregular arrangement patterns in respective pixels are formed in respective pixel regions defined by the gate bus lines 12 and the drain bus lines 14. Thereafter, for example, an organic insulating film is coated on the whole surface of the substrate, and is subjected to a specified processing to form wrinkle-like irregularities on the surface of the organic insulating film. Since the orientations of the wrinkle-like irregularities formed on the surface of the organic insulating film are controlled by the structures 50 formed in irregular shapes in the respective pixels, they are formed in irregular shapes in the respective pixels. By this, an under layer 34 with irregularities is formed on the substrate.

Figure 1B:
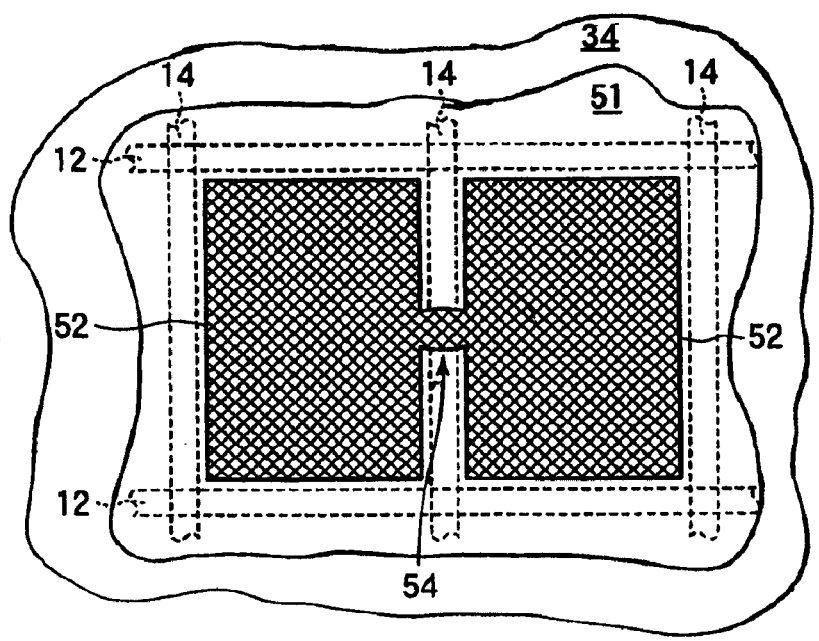

Next, as shown in FIG. 1B, for example, a metal film 51 with light reflectivity is formed on the whole surface of the substrate on the underlayer 34 (step S1 of FIG. 3). Irregularities profiling the surface of the under layer are formed on the surface of the metal film 51. Subsequently, a colored resist is coated on the whole surface of the metal film 51 to form a colored resist layer (step S2). Next, the colored resist layer is exposed to light while using a photomask (step S3) and is developed (step S4), so that colored resist patterns 52 arranged regularly in the respective pixel regions are formed.

Figure 2A:
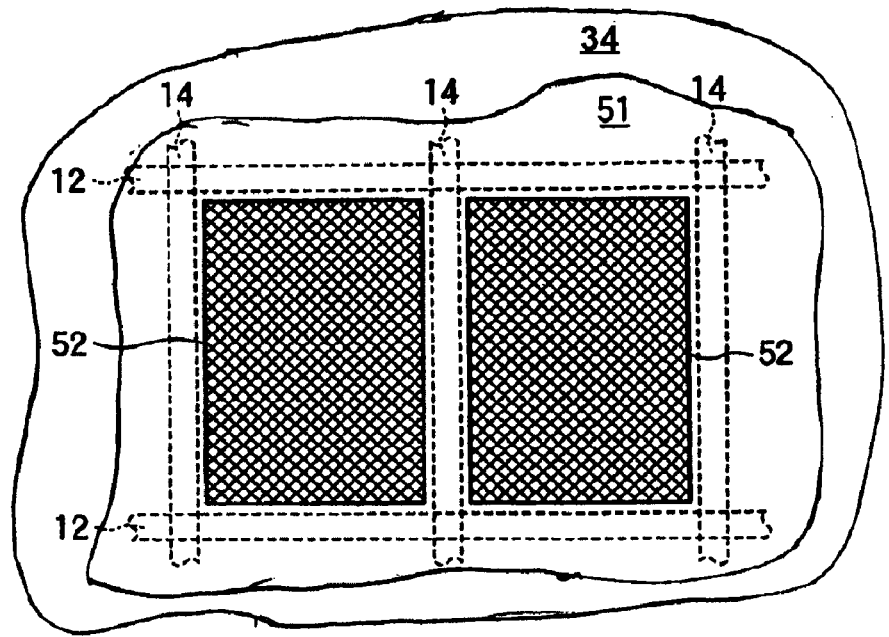
FIGS. 2A and 2B are views showing the manufacturing method of the array substrate according to the embodiment of the invention.

Next, an optical inspection for detecting a defect of the colored resist pattern 52 is performed (step S5). Since the light transmittance is decreased by the colored resist patterns 52 formed in the respective pixel regions, the irregularities on the surface of the metal film 51 are not recognized in this optical inspection. Accordingly, since there does not occur a change of contrast in the respective pixels by the irregular irregularities of the surface of the metal film 51, the defect of the colored resist pattern 52 can be optically easily detected by pattern comparison. As a result of the optical inspection, when the defect does not occur in the colored resist pattern 52, the procedure proceeds to an etching process (step S6). When a defect over several pixels or many defects occur in the colored resist pattern 52, the colored resist pattern 52 is peeled off (step S7), the procedure returns to step S2 and reprocessing is performed. When defects occurring in the colored resist pattern 52 are on such a level that several places are impaired, the procedure proceeds to a defect repair process (step S8). In the substrate shown in FIG. 1B, there occurs such a defect that the adjacent colored resist patterns 52 are connected to each other through a connection part 54. If the metal film 51 is etched in this state without doing anything, reflecting electrodes 17 formed in both the pixel regions are short-circuited. In this embodiment, before the metal film 51 is etched, for example, laser light with a low wavelength is irradiated to cut the connection part 54. By this, as shown in FIG. 2A, the defect of the colored resist pattern 52 is repaired.

Figure 2B:
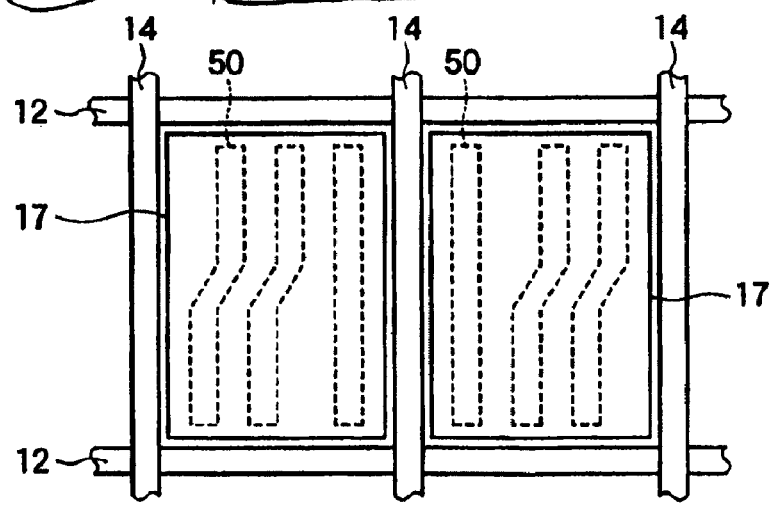

Next, the metal film 51 is etched while using the colored resist pattern 52 as an etching mask (step S6). By this, the reflecting electrodes 17 are formed in the respective pixel regions. Subsequently, as shown in FIG. 2B, the colored resist pattern 52 is peeled off (step S9). Irregularities profiling the irregularities of the under layer are formed on the surface of the reflecting electrode 17. Through the above steps, the TFT substrate is completed. Incidentally, in this embodiment, although the colored resist pattern 52 is used as the resist pattern for preventing the irregularities of the surface of the metal film 51 from being optically recognized, a thick film resist pattern having a thick film may be used. The thick film resist pattern is obtained by coating a usually used resist to form a thick film. By using the thick film resist pattern, the light transmittance of the resist pattern is decreased, and the surface of the resist pattern is flattened. Thus, the change of contrast in the respective pixels by the irregularities of the surface of the metal film 51 becomes hard to be recognized, and it becomes easy to perform the optical inspection of the resist pattern by the pattern comparison.

In this embodiment, when the metal film 51 with the irregularities in the respective pixels is patterned, the colored resist pattern 52 (or thick film resist pattern) is used. Thus, the change of contrast in the respective pixels becomes hard to be recognized, and the optical inspection by the pattern comparison is easy. Besides, in this embodiment, after the colored resist pattern 52 is formed and before the metal film 51 is etched, the optical inspection of the colored resist pattern 52 and the defect repair are performed. Thus, since the metal film 51 is etched while the colored resist pattern 52 without defect is used as a mask, defects such as a short circuit do not occur in the reflecting electrode 17. Since the optical inspection and the defect repair of the colored resist pattern 52 performed in the middle of the process are easy as compared with the defect inspection and the defect repair of the reflecting electrode 17 after the completion of the TFT substrate, it is possible to suppress an increase in the number of steps of the defect repair process and an increase in dot defects. Accordingly, when the manufacturing method of the array substrate according to this embodiment is used, the liquid crystal display device with excellent display quality can be manufactured at low cost.

Hereinafter, the manufacturing method of the array substrate according to this embodiment and the manufacturing method of the liquid crystal display device using the same will be described more specifically by use of examples.

Example 1

Figure 4:
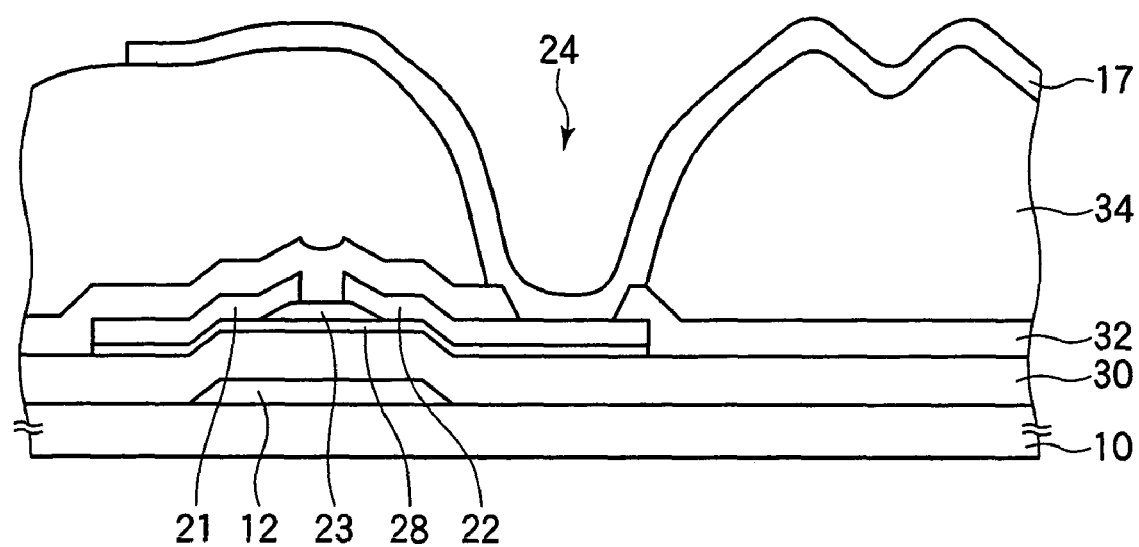
FIG. 4 is a sectional view showing a structure of a TFT substrate fabricated by using a manufacturing method of an array substrate according to example 1 of the embodiment of the invention.

First, a manufacturing method of an array substrate according to example 1 and a manufacturing method of a liquid crystal display device using the same will be described. FIG. 4 shows a sectional structure of a vicinity of a TFT of a TFT substrate fabricated by using the manufacturing method of the array substrate according to this example. As shown in FIG. 4, a gate electrode (gate bus line) 12 made of laminated layers of, for example, aluminum (Al)/molybdenum nitride (MoN)/Mo is formed on a glass substrate 10 having an insulating property. An insulating film (gate insulating film) 30 made of, for example, a SiN film is formed on the gate electrode 12 and on the whole surface of the substrate. An operational semiconductor layer 28 made of amorphous silicon (a-Si) and having a specified shape is formed on the insulating film 30. A channel protection film 23 made of, for example, a SiN film is formed on the operational semiconductor layer 28. A drain electrode 21 and a source electrode 22 are formed on the channel protection film 23 to be separated from each other by a specified interval and to be opposite to each other. The drain electrode 21 and the source electrode 22 are formed of laminated layers of, for example, titanium (Ti)/Al/Ti. The drain electrode 21 is electrically connected to the adjacent drain bus line 14. A protection film 32 made of, for example, a SiN film is formed on the drain electrode 21 and the source electrode 22 and on the whole surface of the substrate. An organic insulating film 34 having a wrinkle-like surface is formed on the whole surface of the protection film 32. A reflecting electrode (pixel electrode) 17 made of, for example, laminated layers of Mo/Al is formed in each pixel region on the organic insulating film 34. The reflecting electrode 17 is electrically connected to the source electrode 22 through a contact hole 24 opened in the organic insulating film 34 and the protection film 32 on the source electrode 22.

Figure 5:
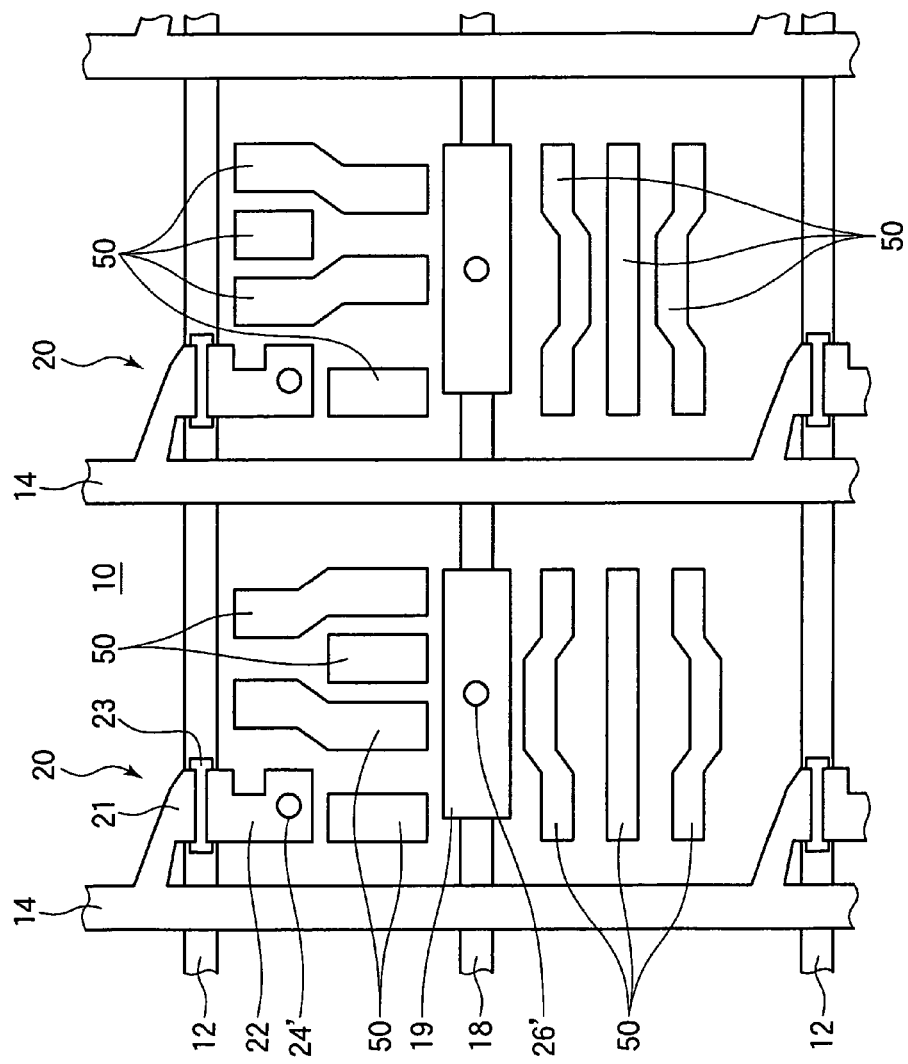
FIG. 5 is a view showing the manufacturing method of the array substrate according to example 1 of the embodiment of the invention.

Next, the manufacturing method of the array substrate according to this example and the manufacturing method of the liquid crystal display device using the same will be described. FIGS. 5 to 9 show the manufacturing method of the array substrate according to this example. First, Al/MoN/Mo films are formed in this order on the whole surface of a glass substrate 10 to form a metal film. Next, a resist is coated on the metal film to form a resist layer. Subsequently, the resist layer is patterned by using a photolithography method to form resist patterns in formation regions of gate bus lines 12, storage capacitor bus lines 18 and structures 50. The metal film is etched while using the resist patterns as masks, and then, the resist patterns are peeled off, so that as shown in FIG. 5, the gate bus lines 12, the storage capacitor bus lines 18 and the structures 50 are formed. The structures 50 are formed in irregular arrangement patterns in the respective pixels.

Next, a SiN film, an a-Si layer and a SiN film are continuously formed in this order, and a resist is coated on the whole surface of the substrate to form a resist layer. Subsequently, the photolithography method is used to pattern the resist layer, so that a resist pattern is formed in the formation region of a channel protection film 23. The SiN film of the upper layer is etched while using this resist pattern as a mask, and then, the resist pattern is peeled off to form the channel protection film 23. Next, Ti/Al/Ti films are formed in this order to form a metal film. Next, a resist is coated on the metal film to form a resist layer. Next, the photolithography method is used to pattern the resist layer, so that resist patterns are formed in formation regions of drain electrodes 21, source electrodes 22, drain bus lines 14 and storage capacitor electrodes 19. The metal film is etched while using the resist patterns as masks, and then, the resist patterns are peeled off, so that the drain electrodes 21, the source electrodes 22, the drain bus lines 14 and the storage capacitor electrodes 19 are formed.

Next, for example, a SiN film is formed on the drain electrodes 21, the source electrodes 22, the drain bus lines 14 and the storage capacitor electrodes 19 and on the whole surface of the substrate to form a protection film 32. Next, a resist is coated on the whole surface of the protection film 32 to form a resist layer. Subsequently, the resist layer is patterned by using the photolithography method to form a resist pattern in which a formation region of a contact hole is opened. The protection film 32 is etched while using this resist pattern as a mask, and then, the resist pattern is peeled off, so that a contact hole 24' on the source electrode 22 and a contact hole 26' on the storage capacitor electrode 19 are formed.

Figure 6:
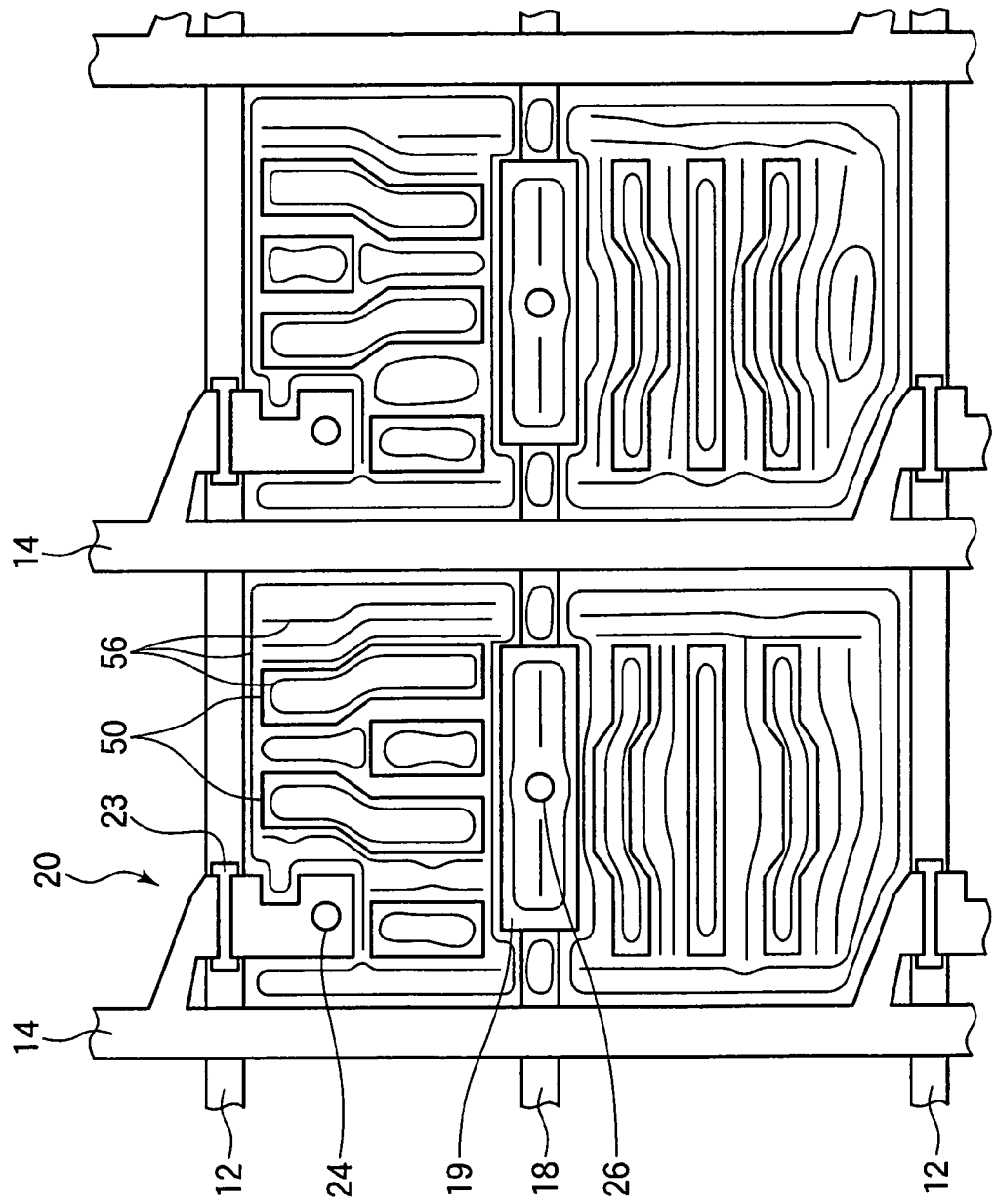
FIG. 6 is a view showing the manufacturing method of the array substrate according to example 1 of the embodiment of the invention.

Next, an organic insulating film (flattening film, resist film, etc.) 34 is coated on the whole surface of the protection film 32. Next, the organic insulating film 34 is opened at the same positions as the contact holes 24' and 26', so that as shown in FIG. 6, contact holes 24 and 26 are formed. Next, after a heat treatment at 150° C. for 1 hour is performed, P is ion doped by using $PH_3$ under conditions of 40 sccm, 100 W and an acceleration voltage of about 20 kV. Thereafter, a heat treatment at 215° C. for 1 hour is again performed. By this, orientations are controlled by the structures 50 and wrinkle-like irregularities 56 with irregular shapes in the respective pixels are formed on the surface of the organic insulating film 34.

Figure 7:
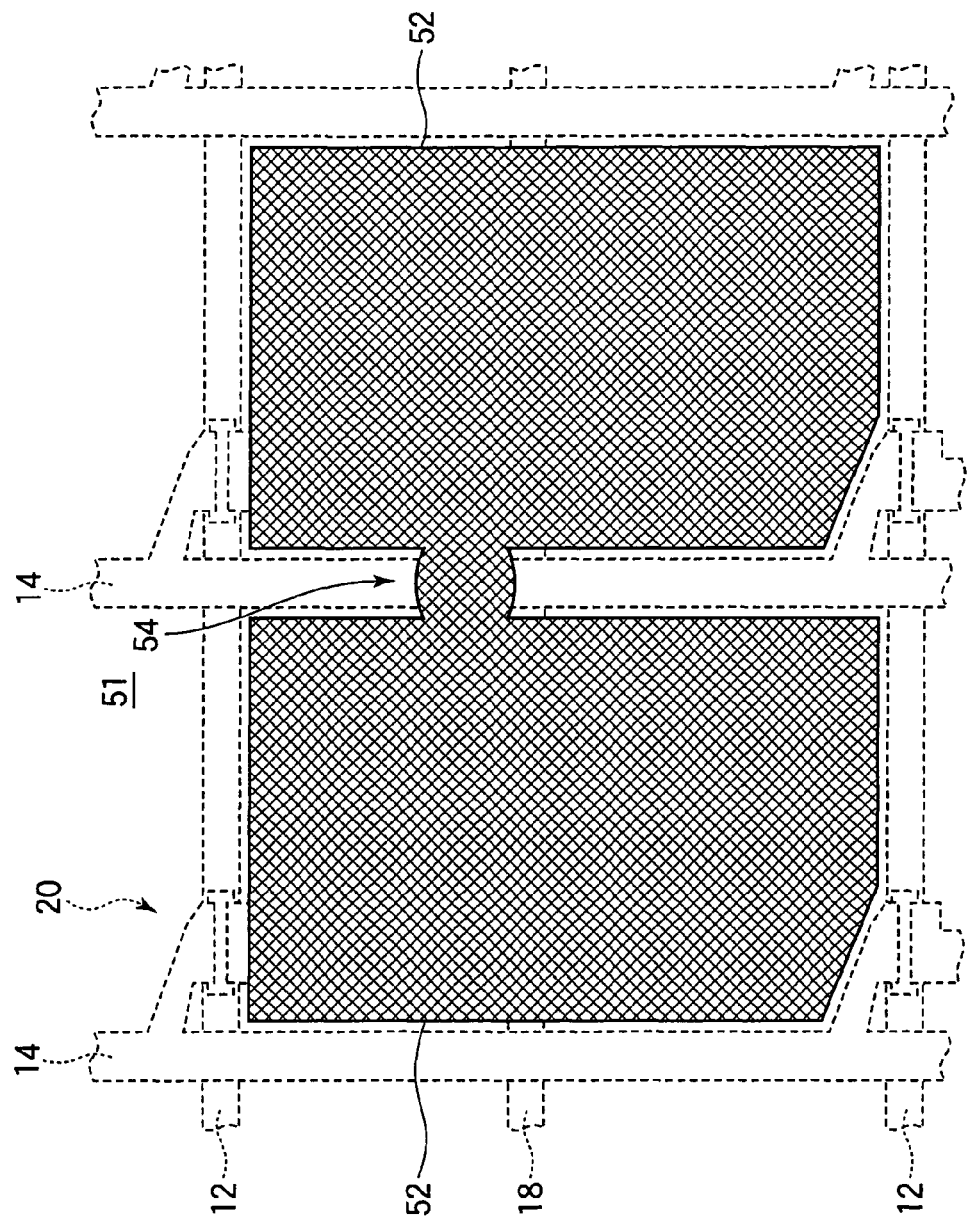
FIG. 7 is a view showing the manufacturing method of the array substrate according to example 1 of the embodiment of the invention.

Next, as shown in FIG. 7, Mo/Al films are formed in this order on the whole surface of the organic insulating film 34 to form a metal film 51. Wrinkle-like irregularities profiling the surface of the organic insulating film 34 are formed on the surface of the metal film 51. Next, a colored resist (for example, black resist) is coated on the whole surface of the metal film 51 to form a colored resist layer with a film thickness of 1.5 µm to 2.0 µm. Subsequently, the photolithography method is used to pattern the colored resist layer, so that colored resist patterns 52 regularly arranged in the respective pixel regions are formed.

Figure 8:
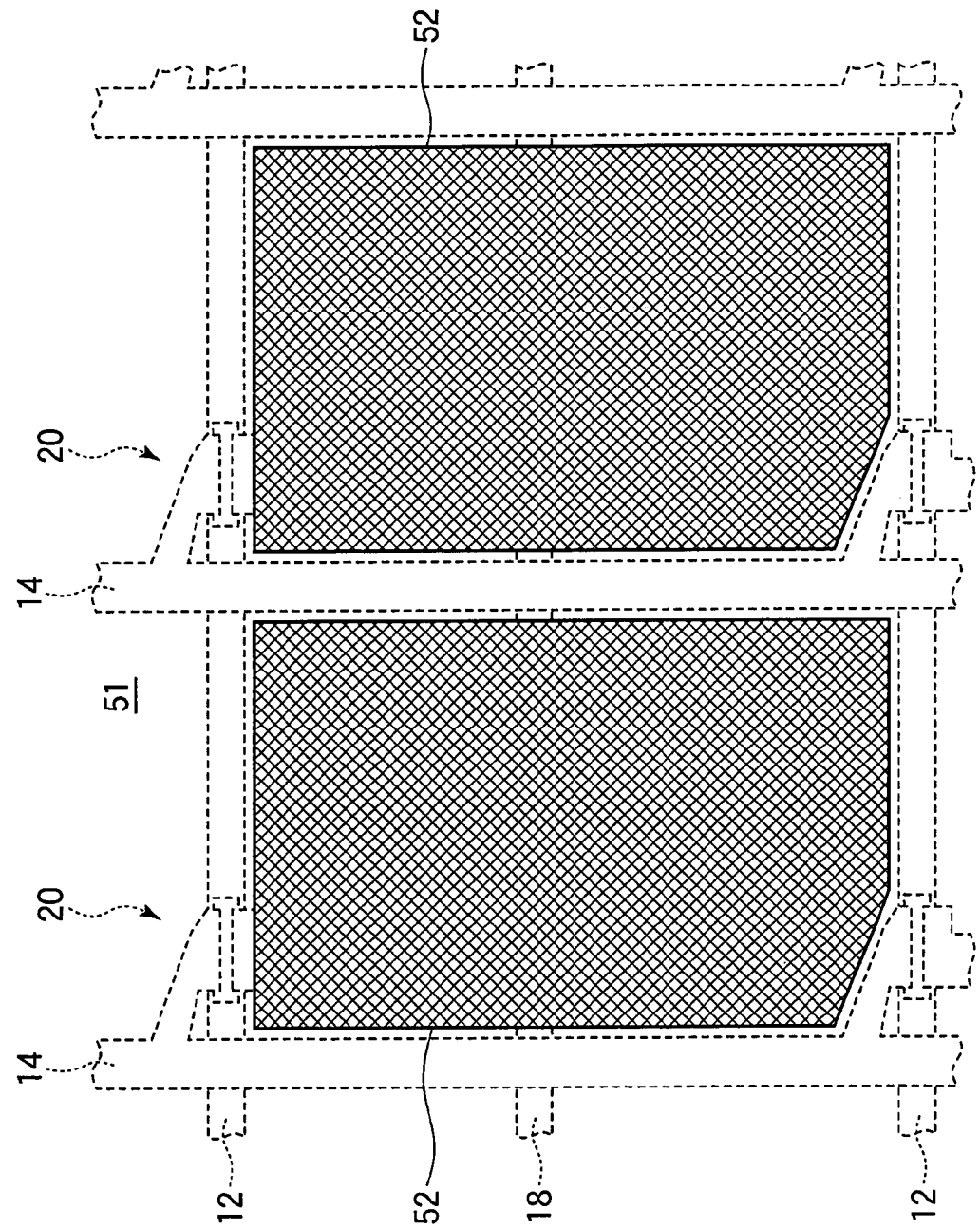
FIG. 8 is a view showing the manufacturing method of the array substrate according to example 1 of the embodiment of the invention.

Next, an optical inspection of the colored resist patterns 52 is performed using an optical inspection device. In this optical inspection, the wrinkle-like irregularities of the surface of the metal film 51 are not recognized because of the colored resist patterns 52 formed in the respective pixel regions. Accordingly, since there does not occur a change of contrast in the respective pixels due to the irregularities of the surface of the metal film 51, a defect of the colored resist patterns 52 can be optically easily detected by pattern comparison. As a result of the optical inspection, for example, as shown in FIG. 7, there is detected such a defect that the adjacent colored resist patterns 52 are connected to each other through a connection part 54. In the case where the defect as stated above is detected, before the metal film 51 is etched, for example, laser light with a short wavelength is irradiated to cut the connection part 54. By this, as shown in FIG. 8, the defect of the colored resist patterns 52 is repaired. Incidentally, when a defect over several pixels or many defects occur in the colored resist patterns 52, the colored resist patterns 52 are peeled off and reprocessing may be performed.

Figure 9:
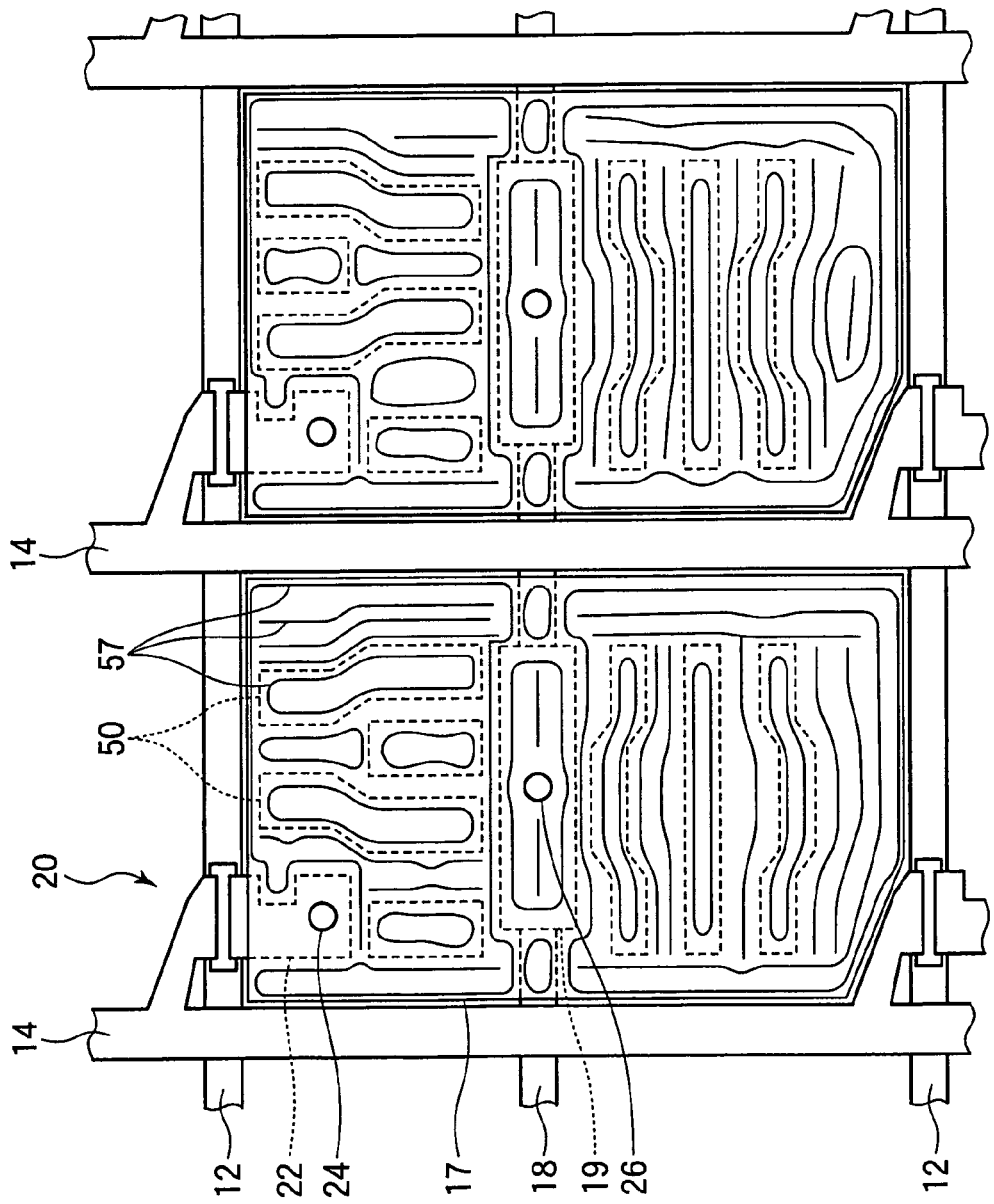
FIG. 9 is a view showing the manufacturing method of the array substrate according to example 1 of the embodiment of the invention.

Next, the metal film 51 is etched while using the colored resist patterns 52 as masks, and then, the colored resist patterns 52 are peeled off, so that as shown in FIG. 9, reflecting electrodes 17 are formed in the respective pixel regions. The reflecting electrode 17 is electrically connected to the source electrode 22 of the TFT 20 through the contact hole 24, and is electrically connected to the storage capacitor electrode 19 through the contact hole 26. Wrinkle-like irregularity parts 57 profiling the surface of the organic insulating film 34 are formed on the surface of the reflecting electrode 17. Subsequently, a heat treatment at, for example, 215° C. for 1 hour is performed, and the TFT substrate of the reflective liquid crystal display device is completed. Thereafter, the liquid crystal display device is completed through a cell process in which the TFT substrate is attached to a CF substrate fabricated through a CF process, and liquid crystal is sealed between both the substrates, and a module process in which a driver IC or the like is mounted.

Example 2

Next, a manufacturing method of an array substrate according to example 2 of the embodiment will be described with reference to FIGS. 5 to 9 which have been already exhibited. First, Al/MoN/Mo films are formed in this order on the whole surface of a glass substrate 10 to form a metal film. Next, a resist is coated on the metal film to form a resist layer. Subsequently, the photolithography method is used to pattern the resist layer, so that resist patterns are formed in formation regions of gate bus lines 12, storage capacitor bus lines 18 and structures 50. The metal film is etched while using the resist patterns as masks, and then, the resist patterns are peeled off, so that the gate bus lines 12, the storage capacitor bus lines 18 and the structures 50 are formed (see FIG. 5). The structures 50 are formed in irregular arrangement patterns in the respective pixels.

Next, a SiN film, an a-Si film and a SiN film are continuously formed in this order, and a resist is coated on the whole substrate to form a resist layer. Subsequently, the resist layer is patterned by using the photolithography method to form a resist pattern in a formation region of a channel protection film 23. The SiN film of the upper layer is etched while using this resist pattern as a mask, and then, the resist pattern is peeled off, so that the channel protection film 23 is formed.

Next, Ti/Al/Ti films are formed in this order to form a metal film. Next, a resist is coated on the metal film to form a resist layer. Next, the photolithography method is used to pattern the resist layer, so that resist patterns are formed in formation regions of drain electrodes 21, source electrodes 22, drain bus lines 14 and storage capacitor electrodes 19. The metal film is etched while using the resist patterns as masks, and then, the resist patterns are peeled off, so that the drain electrodes 21, the source electrodes 22, the drain bus lines 14 and the storage capacitor electrodes 19 are formed.

Next, for example, a SiN film is formed on the drain electrodes 21, the source electrodes 22, the drain bus lines 14 and the storage capacitor electrodes 19 and on the whole surface of the substrate to form a protection film 32. Next, a resist is coated on the whole surface of the protection film 32 to form a resist layer. Subsequently, the photolithography method is used to pattern the resist layer, so that a resist pattern in which a formation region of a contact hole is opened is formed. The protection film 32 is etched while using this resist pattern as a mask, and then, the resist pattern is peeled off, so that a contact hole 24' on the source electrode 22 and a contact hole 26' on the storage capacitor electrode 19 are formed.

Next, an organic insulating film (flattening film, resist film, etc.) 34 is coated on the whole surface of the protection film 32. Next, the organic insulating film 34 is opened at the same positions as the contact holes 24' and 26' to form contact holes 24 and 26. Next, after a heat treatment at 150° C. for 1 hour is performed, P is ion doped by using $PH_3$ under conditions of 40 sccm, 100 W, and an acceleration voltage of 20 kV. Thereafter, a heat treatment at 215° C. for 1 hour is again performed. By this, orientations are controlled by the structures 50 and wrinkle-like irregularity parts 56 having irregular shapes in the respective pixels are formed on the surface of the organic insulating film 34 (see FIG. 6).

Next, Mo/Al films are formed in this order on the whole surface of the organic insulating film 34 to form a metal film 51 (see FIG. 7). Wrinkle-like irregularities profiling the surface of the organic insulating film 34 are formed on the surface of the metal film 51. Next, a resist is coated on the whole surface of the metal film 51 to form a resist layer. In general, although a resist layer is formed to have a thickness of 1.5 μm to 2.0 μm, in this embodiment, the resist layer is formed into a thick film of 3.0 μm or more. However, when the thickness of the resist layer is thick, a tact time of a photolithography process becomes long, and therefore, it is desirable that the thickness of the resist layer is about 4.0 μm or less. Subsequently, the thick resist layer formed to be as thick as 3.0 μm to 4.0 μm is patterned by the photolithography method. By this, similarly to the colored resist patterns 52 shown in FIG. 7, thick film resist patterns regularly arranged in the respective pixel regions and having a thickness of 3.0 μm to 4.0 μm is formed.

Next, an optical inspection device is used to perform an optical inspection of the thick film resist patterns. In this optical inspection, the wrinkle-like irregularities of the surface of the metal film 51 are not recognized because of the thick film resist patterns formed in the respective pixel regions. Accordingly, since there does not occur a change of contrast in the respective pixels due to the irregularities of the surface of the metal film 51, a defect of the thick film resist pattern can be optically easily detected by pattern comparison. As a result of the optical inspection, there is detected such a defect that the adjacent resist patterns are connected to each other through a connection part 54. In the case where the defect as stated above is detected, before the metal film 51 is etched, for example, laser light with a short wavelength is irradiated to cut the connection part 54. By this, similarly to the colored resist patterns 52 shown in FIG. 8, the defect of the thick film resist patterns is repaired. Incidentally, a defect over several pixels or many defects occur in the thick film resist patterns, the thick film resist patterns are peeled off and reprocessing may be performed.

Next, the metal film 51 is etched while using the thick film resist patterns as masks, and then, the thick film resist patterns are peeled off, so that reflecting electrodes 17 are formed in the respective pixels (see FIG. 9). The reflecting electrode 17 is electrically connected to the source electrode 22 of the TFT 20 through the contact hole 24, and is electrically connected to the storage capacitor electrode 19 through the contact hole 26. Wrinkle-like irregularity parts 57 profiling the surface of the organic insulating film 34 are formed on the surface of the reflecting electrode 17. Subsequently, a heat treatment at, for example, 215° C. for 1 hour is performed, and the TFT substrate of the reflective liquid crystal display device is completed.

This invention is not limited to the above embodiment, but can be variously modified.

For example, in the above embodiment, although the reflective liquid crystal display device is cited as the example, the invention is not limited to this, but can be applied to a transflective liquid crystal display device.

Besides, in the above embodiment, although the TFT substrate with the channel protection film type TFTs is cited as the example, the invention is not limited to this, but can be applied to a TFT substrate with channel etch type TFTs.

What is claimed is:

1. A manufacturing method of an array substrate, comprising the steps of:
   forming, within each pixel, at least a gate bus of a thin film transistor and a plurality of structures, the gate bus and the structures being formed from a metal film formed on the substrate, and the structures being arranged in an irregular pattern;
   forming an under layer on the substrate over the thin film transistor and over the plurality of structures to form irregularities, controlled by the plurality of structures, on a surface of the under layer;
   forming on the under layer a thin film with irregularities profiling the surface of the under layer;
   forming a resist layer on the thin film;
   forming a regularly arranged resist pattern by patterning the resist layer;
   performing an optical inspection of the resist layer to optically detect a defect in the resist pattern; and
   etching the thin film while using the resist pattern as a mask;
   wherein the resist pattern is formed without openings within each pixel so that the irregularities of the thin film are not recognized through the resist pattern in the optical inspection.

2. A manufacturing method of an array substrate according to claim 1, wherein the resist pattern is a colored resist pattern.

3. A manufacturing method of an array substrate according to claim 1, wherein the resist pattern is a thick film resist pattern with a thick film.

4. A manufacturing method of an array substrate according to claim 3, wherein a thickness of the thick film resist pattern is from 3.0 μm to 4.0 μm.

5. A manufacturing method of an array substrate according to claim 1, further comprising the step of repairing a defect of the resist pattern detected by the optical inspection before the thin film is etched.

6. A manufacturing method of an array substrate according to claim 1, further comprising the steps of peeling off the resist pattern in which the defect is detected by the optical inspection and forming a resist layer again on the thin film before the thin film is etched.

7. A manufacturing method of a liquid crystal display device in which a pair of substrates are fabricated, the substrates are attached, and liquid crystal is sealed between the substrates, wherein at least one of the substrates is fabricated by using a manufacturing method of an array substrate according to claim 1.

* * * * *